(12) United States Patent
Friedrich et al.

(10) Patent No.: US 7,271,657 B2
(45) Date of Patent: Sep. 18, 2007

(54) TRAVELING WAVE AMPLIFIER

(75) Inventors: Martin Friedrich, Gelsenkirchen (DE);
Christian Grewing, Düsseldorf (DE);
Giuseppe Li Puma, Bochum (DE);
Christoph Sandner, Villach (AT);
Andreas Wiesbauer, Pörtschach (AT);
Kay Winterberg, Kempen (DE);
Stefan Van Waasen, Sollentuna (SE)

(73) Assignee: Infineon Technologies AG, Munich (DE)

( * ) Notice: Subject to any disclaimer, the term of this patent is extended or adjusted under 35 U.S.C. 154(b) by 150 days.

(21) Appl. No.: 11/119,349

(22) Filed: Apr. 29, 2005

(65) Prior Publication Data
US 2005/0248407 A1    Nov. 10, 2005

(30) Foreign Application Priority Data
Apr. 29, 2004 (DE) .................... 10 2004 021 155

(51) Int. Cl.
*H03F 3/60* (2006.01)
*H03F 3/68* (2006.01)
(52) U.S. Cl. ..................... 330/286; 330/295
(58) Field of Classification Search ............ 330/295
See application file for complete search history.

(56) References Cited

U.S. PATENT DOCUMENTS

| | | | | |
|---|---|---|---|---|
| 3,599,104 A | * | 8/1971 | Peil et al. .................... 327/351 |
| 5,365,197 A | * | 11/1994 | Ikalainen .................... 330/286 |
| 5,485,118 A | * | 1/1996 | Chick .......................... 330/52 |
| 5,550,513 A | * | 8/1996 | Wong ........................ 330/286 |
| 6,049,250 A | | 4/2000 | Kintis et al. ................... 330/54 |
| 6,215,360 B1 | * | 4/2001 | Callaway, Jr. .............. 330/310 |
| 6,255,910 B1 | | 7/2001 | Forstner ..................... 330/289 |
| 6,452,715 B1 | * | 9/2002 | Friedrich .................... 359/334 |
| 6,727,762 B1 | * | 4/2004 | Kobayashi ................... 330/295 |
| 6,788,140 B2 | * | 9/2004 | Cameron et al. ............ 330/149 |
| 6,788,148 B2 | * | 9/2004 | Orr et al. .................... 330/286 |
| 7,132,890 B2 | * | 11/2006 | Landolt ....................... 330/286 |

FOREIGN PATENT DOCUMENTS

DE    198 27 702 A1    12/1999
DE    10304873 A1  *  11/2004

OTHER PUBLICATIONS

Ahn et al., "A 0.5-8.5-GHz Fully Differential CMOS Distributed Amplifier", IEEE Journal of Solid-State Circuits, vol. 37, No. 8, Aug. 2002, pp. 985-993, (9 pages).

* cited by examiner

*Primary Examiner*—Benny T. Lee
*Assistant Examiner*—Krista Flanagan
(74) *Attorney, Agent, or Firm*—Maginot, Moore & Beck

(57) ABSTRACT

A traveling wave amplifier comprises a first normally off MOS transistor having a drain, source and gate terminal. The drain terminal is connected to a node of a drain line, which is connected to a first supply voltage potential via a connecting resistor. The gate terminal is connected to a node of a gate line, onto which an input signal is coupled. The source terminal is coupled to a second supply voltage potential via a first resistor. The traveling wave amplifier also comprises at least one second normally off MOS transistor. In addition, the traveling wave amplifier further comprises a normally off bias MOS transistor. The normally off bias MOS transistor forms a current mirror with at least one of the second normally off MOS transistors. An output signal of the traveling wave amplifier is tapped off on the drain line.

18 Claims, 3 Drawing Sheets

TRAVELING WAVE AMPLIFIER

BACKGROUND

The invention relates to a traveling wave amplifier in particular for amplifying a high-frequency signal over a large frequency range.

Traveling wave amplifiers, which are also referred to as distributed amplifiers, serve for amplifying high-frequency signals. In this case, a plurality of amplifier stages are connected up to one another in such a way that their capacitances are isolated but the output currents are additively combined with one another. By virtue of the addition of the amplified output currents, although it is possible initially to obtain only a moderate amplification, the distributed capacitances nevertheless permit a large frequency bandwidth.

So-called traveling field tubes have been used for radiofrequency amplification in the past. Nowadays, semiconductor components (transistors) are used as active, amplifying elements. Increasing miniaturization and the widespread use of microwaves for data transmission in frequency ranges of between 2 and 11 GHz, by way of example, are increasingly leading to the use of CMOS components. Suitable amplifiers are required particularly for future so-called UWB transmission technologies (ultra wide band). In order to provide small radiofrequency amplifiers that are favorable in respect of consumption, the use of normally off CMOS transistors is particularly suitable. However, normally off CMOS transistors require a bias voltage potential or bias potential to be fed in for the purpose of setting their operating points.

FIG. 1 shows a CMOS traveling wave amplifier according to the prior art, such as is illustrated for example in Hee-Tae Ahn, David J. Allstot, "A 0.5-8.5 GHz Fully Differential CMOS Distributed Amplifier" in IEEE Journal of Solid-state Circuits, vol. 37, No. 8, Aug. 2002.

Accordingly, four transistors T1-T4 are provided, which are arranged in parallel in a common-source connection. The drain terminals D of the transistors T1-T4 are connected to a drain line DL, which is connected to a first supply voltage potential VDD, delay elements DE being illustrated schematically in each case between the drain terminals D of the transistors T1-T4. The delay elements DE represent properties of the corresponding lines. The drain line DL is connected, at the drain terminal D of the first transistor T1, to a ground potential GND via a first resistor R1, and it is connected, at the drain terminal D of the fourth transistor T4, to the ground potential GND via a second resistor R2. An output signal OUT can be tapped off at the drain terminal D of the fourth transistor T4. The source terminals of the transistors T1-T4 are connected to the ground potential GND.

The gate terminals G of the transistors T1-T4 are connected to a gate line GL, into which a high-frequency input signal IN is coupled at an input terminal IP. Delay elements DE, as line properties, are depicted schematically between the nodes of the gate line GL to which the gate terminals G of the transistors T1-T4 are connected. The gate line GL is connected, at the gate terminal G of the fourth transistor T4, to the ground potential GND via a third resistor R3. Furthermore, a bias voltage source VS is connected between the gate line GL and the ground potential GND, and raises the gate line GL and thus the gate terminals G of the transistors T1-T4 to a bias potential UBIAS. This last is necessary since the transistors T1-T4 are provided as normally off CMOS transistors. However, the coupling-in of the bias potential via the input or the gate line is very sensitive to temperature and manufacturing fluctuations. Moreover, the bias potential UBIAS has to be carefully tracked in the event of changes in the input signal level in order to ensure the operating point setting.

Therefore, it is an object of the present invention to provide a traveling wave amplifier which has normally off MOS transistors, the operating point setting thereof being performed favorably in respect of complexity in a manner tolerant toward temperature and manufacturing fluctuations. In particular, the intention is for the traveling wave amplifier to be able to be embodied in differential fashion and to have a low current consumption.

SUMMARY

Accordingly, a traveling wave amplifier is provided, having a first normally off MOS transistor having a drain, source and gate terminal, the drain terminal being connected to a node of a drain line, which is connected to a first supply voltage potential via a connecting resistor, the gate terminal being connected to a node of a gate line, onto which an input signal is coupled in, and the source terminal being coupled to a second supply voltage potential via a first resistor.

The traveling wave amplifier according to the invention furthermore has at least one second normally off MOS transistor having a drain, source and gate terminal, the drain terminal being connected to a second node of the drain line, the gate terminal being connected to a second node of the gate line and the source terminal being coupled to the second supply voltage potential via a second resistor.

The traveling wave amplifier according to the invention additionally has a normally off bias MOS transistor having a drain, source and gate terminal, the drain terminal being connected to a reference current source, the gate terminal being connected to the drain terminal and, via a coupling-in resistor to the gate line, and the source terminal being connected to the second supply voltage potential via a terminating resistor. In this case, the normally off bias MOS transistor forms a current mirror with at least one of the second normally off MOS transistors, and it is possible for an output signal of the traveling wave amplifier to be tapped off at a node on the drain line.

Moreover, a differential traveling wave amplifier according to the invention is provided, having a gate line pair, into which a differential input signal is coupled, it being possible for the center potential of the input signal to be tapped off at a ground node between two voltage divider resistors connected in series between the corresponding gate lines.

The differential traveling wave amplifier according to the invention provides a drain line pair, at which a differential output signal can be tapped off, the corresponding drain lines in each case being connected to a first supply voltage potential via a resistor.

The differential traveling wave amplifier according to the invention has at least one differential amplifier stage, which has a first and second MOS amplification transistor and a MOS current source transistor each having a drain, source and gate terminal. In this case, the drain terminals of the MOS amplification transistors are connected to in each case one of the drain lines, and the gate terminals of the MOS amplification transistors are connected in each case to one of the gate lines. The source terminals of the MOS amplification transistors are connected to the drain terminal of the MOS current source transistor, and the source terminal of the MOS current source transistor is coupled to a second supply voltage potential.

The differential traveling wave amplifier according to the invention furthermore has a cascode arrangement, which has a first and a second MOS cascode transistor each having a drain, source and gate terminal, the drain terminal of the first MOS cascode transistor being connected to a reference current source, the drain terminal and the gate terminal of the first MOS cascode transistor being connected to the ground node, the source terminal of the first MOS cascode transistor and the drain terminal and the gate terminal of the second MOS cascode transistor being connected to the gate terminal of the at least one MOS current source transistor, and the source terminal of the second MOS cascode transistor being connected to the second supply voltage potential. In this case, the at least one differential amplifier stage and the cascode arrangement form a current mirror.

The idea on which the present invention is based consists in decoupling the operating point setting of the normally off MOS transistors from the input of the traveling wave amplifier and performing it via the termination of the input line or gate line. This is done by forming a current mirror comprising the normally off (amplification) MOS transistors and a bias MOS transistor, and, in the case of the differential traveling wave amplifier, by forming a cascode current mirror of the differential amplifier stages used with the MOS cascode transistors.

This has the advantage that the operating point setting is performed automatically in a manner dependent on the signal level of the input signal or of the center potential in the case of the differential traveling wave amplifier. The operating point setting according to the invention is additionally very robust toward temperature and manufacturing fluctuations since temperature changes immediately change the potentials at the amplifier MOS transistors and cascodes or bias MOS transistors.

In one preferred embodiment, a buffer capacitor is provided between the gate terminal of the normally off bias MOS transistor or of the first cascode MOS transistor and the second supply voltage potential. This optional capacitor advantageously suppresses disturbances due to mismatches and improves the signal properties of the traveling wave amplifier.

The input signal is advantageously coupled in onto the corresponding gate line via a coupling-in capacitor.

The MOS transistors are advantageously all normally off MOS transistors. This has the advantage, in particular, that the traveling wave amplifier according to the invention can be integrated into a digital circuit environment in a manner that is particularly favorable in respect of complexity. Standard CMOS manufacturing technologies are usually used for digital integrated circuits, normally off MOS transistors being provided as controllable switching elements. The traveling wave amplifier according to the invention is then particularly advantageously suitable for applications of digital information transmission, such as for example in UWB applications (ultra wide band).

The input signal preferably has a frequency bandwidth of 2 to 11 GHz. This is the frequency range envisaged for UWB. Furthermore, inductances are provided between the nodes of the gate and/or drain lines.

Further advantageous refinements and developments of the invention are the subject matter of the subclaims and also of the description with reference to the figures.

BRIEF DESCRIPTION OF THE DRAWINGS

The invention is explained in more detail below with reference to the schematic figures and the exemplary embodiments. In the figures in this case.

In the figures, identical or functionally identical elements are provided with the same reference symbols.

DESCRIPTION

Figure 1:
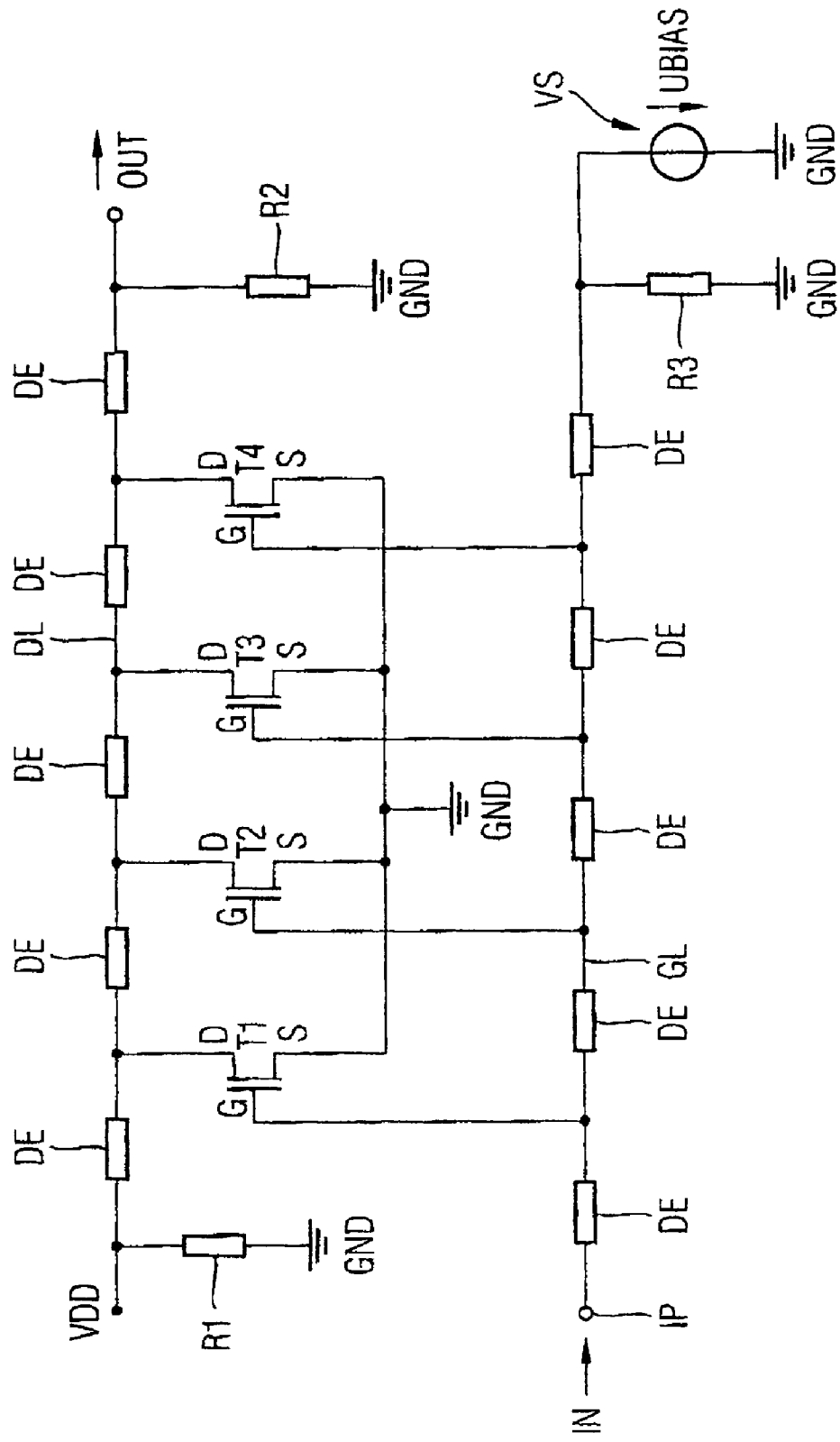
FIG. 1 shows a traveling wave amplifier according to the prior art.
Figure 2:
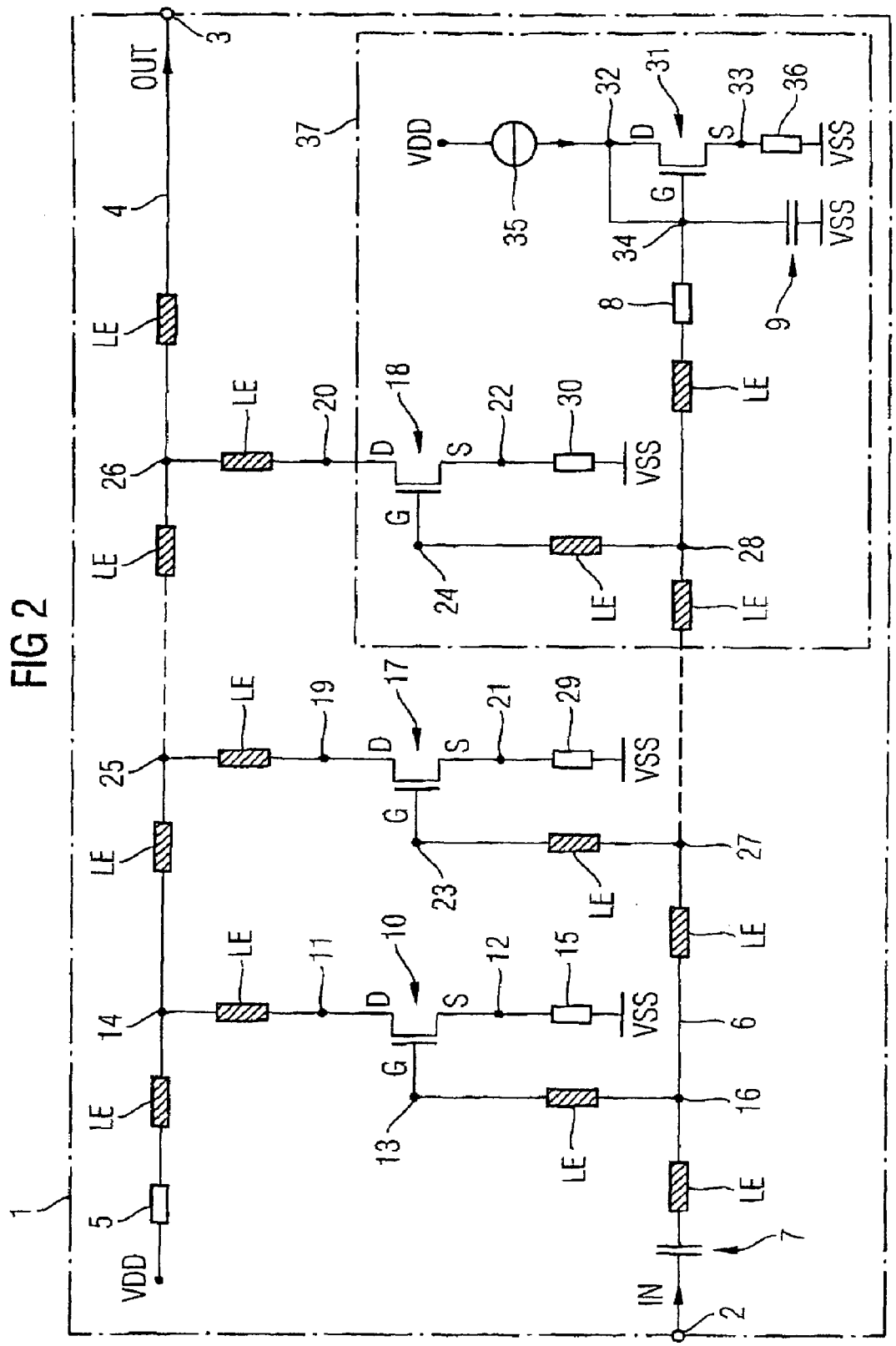
FIG. 2 shows a single-ended traveling wave amplifier according to the invention.

FIG. 2 shows a traveling wave amplifier 1 according to the invention in a single-pole grounded or single-ended embodiment.

The traveling wave amplifier 1 according to the invention has an input 2 for coupling in an input signal IN and an output 3 for coupling out an output signal OUT. A drain line 4 is provided, which is routed to the output 3, and is connected to a first supply voltage potential VDD via a connecting resistor 5.

A gate line 6 is furthermore provided, which is connected to the input 2 via a capacitor 7, and is connected to a second supply voltage potential VSS via a coupling-in resistor 8 and an (optional) buffer capacitor 9.

A first normally off MOS transistor 10 having a drain, source and gate terminal 11, 12, 13 is provided, the drain terminal 11 being connected to a node 14 of the drain line 4, the source terminal 12 being connected to the second supply voltage potential VSS via a first resistor 15, and the gate terminal 13 being connected to a node 16 of the gate line 6.

Further normally off MOS transistors 17, 18 each having a drain, source and gate terminal 19, 20, 21, 22, 23, 24 are provided, the respective drain terminals 19, 20 being connected to second nodes 25, 26 of the drain line 4, and the gate terminals 23, 24 in each case being connected to second nodes 27, 28 of the gate line 6. The source terminals 21, 22 of the further transistors, 17, 18 are connected to the second supply voltage potential VSS via further resistors 29, 30.

A normally off bias MOS transistor 31 having a drain, source and gate terminal 32, 33, 34 is furthermore provided, the drain terminal 32 being connected to a reference current source 35, which is coupled to the first supply voltage potential VDD. The source terminal 33 of the normally off bias MOS transistor 31 is coupled to the second supply voltage potential VSS via a coupling-in resistor 36. The gate terminal 34 and the drain terminal 32 of the bias MOS transistor 31 are connected to one another and connected between the terminating resistor 8 and buffer capacitor 9. The normally off bias MOS transistor 31 and the reference current source thus form a current mirror 37 in each case with one of the normally off MOS transistors 10, 17, 18. The buffer capacitor 9 is merely optional and yields an improved signal behavior. Line elements LE are illustrated on the gate and drain lines 6, 4, and characterize the line properties, such as, for example, inductances, resistances, capacitances.

Through the choice of the current mirror ratios, for example by determining the area of the radio frequency transistors 10, 17, 18 and the area of the bias transistor 31 (by varying the channel length and/or width), and also variation of the connection elements or line elements LE, it is possible to predefine practically any desired transfer line of the traveling wave amplifier 1 according to the invention.

The amplification transistors 10, 17, 18 are generally embodied with a minimal channel length in order to achieve a maximum speed. A particularly low power consumption is additionally achieved as a result. A preferred mirror ratio may be 1:10, by way of example.

Figure 3:
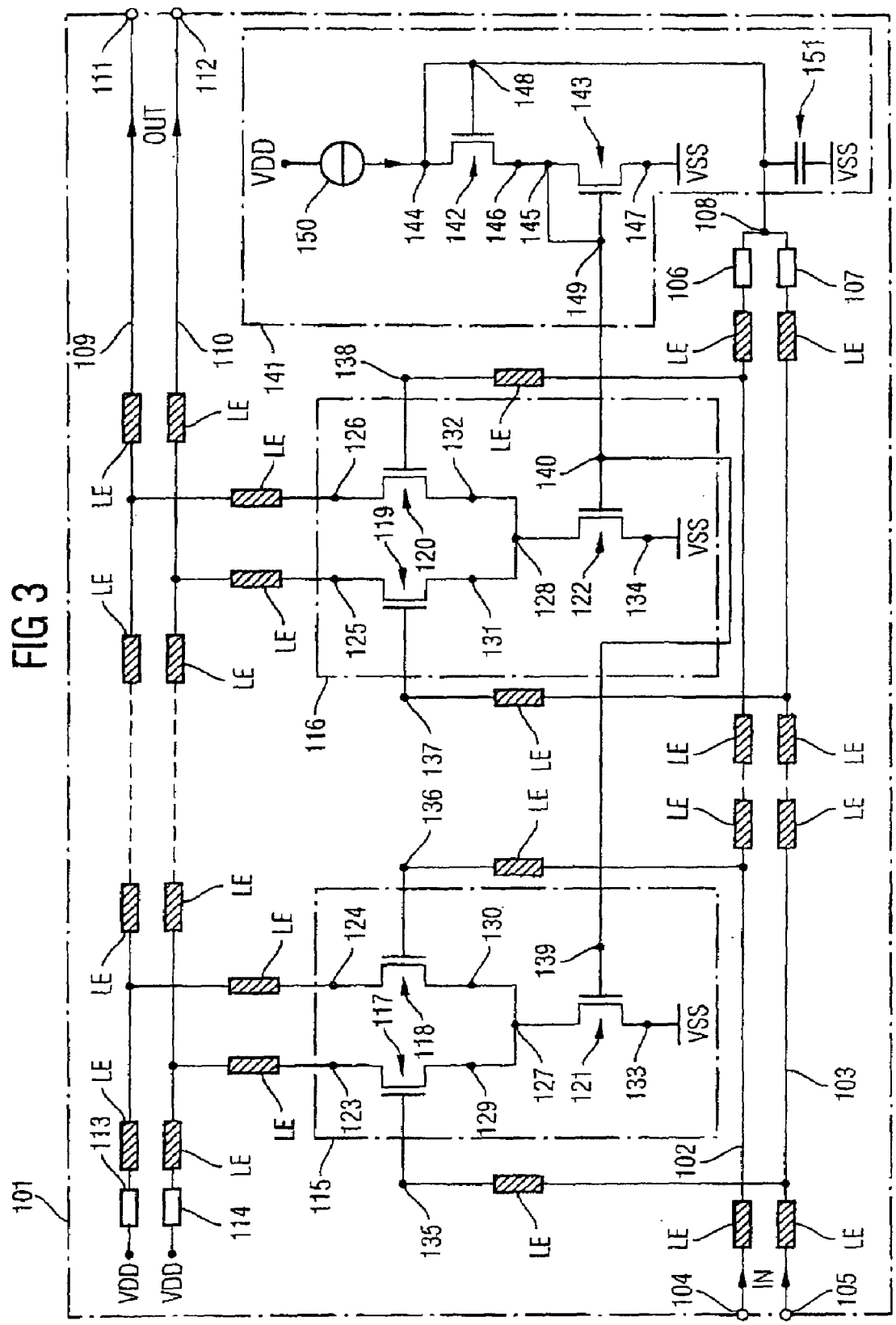
FIG. 3 shows a differential traveling wave amplifier according to the invention.

FIG. 3 shows a differential traveling wave amplifier 101 according to the invention.

A gate line pair 102, 103 is provided, which is connected to an input terminal 104, 105 for the purpose of coupling in a differential input signal IN. Two voltage divider resistors 106, 107 are connected in series between the gate line pair 102, 103, so that the center potential of the differential input signal can be tapped off at a ground node 108 between the two voltage divider resistors 106, 107.

Furthermore, a drain line pair 109, 110 is provided, which is connected to an output terminal pair 111, 112 for the purpose of coupling out a differential output signal OUT. The corresponding drain lines 109, 110 are in each case coupled to a first supply voltage potential VDD via a connecting resistor 113, 114.

The differential traveling wave amplifier 101 according to the invention furthermore has two differential amplifier stages 115, 116, which have in each case a first and a second MOS amplification transistors 117, 118, 119, 120 and in each case a MOS current source transistor 121, 122, each having a drain, source and gate terminal 123-140. In this case, the drain terminals 123-126 of the MOS amplification transistors 117-120 are connected to in each case one of the drain lines 109, 110. The gate terminals 135-138 of the amplification transistors 117-120 are in each case connected to one of the gate lines 102, 103. The source terminals 127, 128 of the MOS amplification transistors 121, 122 are connected to a second supply voltage potential VSS through the current source transistors 121, 122.

A cascode arrangement 141 is provided, which has a first and a second MOS cascode transistor 142, 143 each having a drain, source and gate terminal 144-149, the drain terminal 144 of the first MOS cascode transistor 142 being connected to a reference current source 150, which is connected to the first supply voltage potential VDD. The drain terminal 144 and the gate terminal 148 of the first MOS cascode transistor 142 are connected to the ground node 108. The source terminal 146 of the first MOS cascode transistor 142 and the drain terminal 145 and the gate terminal 149 of the second MOS cascode transistor 143 are connected to the gate terminals 139, 140 of the MOS current source transistors 121, 122. The source terminal 147 of the second MOS cascode transistor 143 is connected to the second supply voltage potential VSS.

The cascode arrangement 141 thus forms a (cascode) current mirror in each case with the differential amplifier stages 115, 116. Line elements LE are illustrated on the gate and drain lines 102, 103, 109, 110 and characterize the line properties, such as, for example, inductances, resistances, capacitances. An optional buffer capacitor 151 is provided between the gate terminal 148 of the first cascode MOS transistor 142 and the second supply voltage potential VSS.

The differential traveling wave amplifier 101 according to the invention is particularly insensitive toward temperature fluctuations since although a temperature change changes the gate potentials at the first MOS cascode 142 and the amplification transistors 117-120, this will merely result in all the potentials being shifted. The operating point setting is therefore not affected thereby. An output characteristic curve of the differential traveling wave amplifier 101 according to the invention can be determined practically arbitrarily through the choice of the size ratios of the current source transistors 121, 122 with the second cascode transistor 143. Through the choice of the normally off MOS transistors and the cascode arrangement, the differential traveling wave amplifier 101 can be combined with other digital electronics in a particularly straightforward manner since CMOS standard technology can be used for production.

The invention thus provides a traveling wave amplifier which can be used over a wide frequency range, for example for ultra wide band applications between 3 and 8 GHz, which is insensitive toward temperature and manufacturing fluctuations, and which has a particularly low power consumption. Furthermore, practically any desired transfer characteristic curves can be achieved through the choice of the amplification transistors and cascode or bias MOS transistors and the line elements.

Although the present invention has been described above on the basis of preferred exemplary embodiments, it is not restricted thereto, but rather can be modified in diverse ways. Thus, the traveling wave amplifier according to the invention will not be restricted to the number of amplification transistors or differential amplifier stages shown. Rather, it is possible to provide as many amplifier stages as desired between drain and gate lines. Modified cascode arrangements or alternative arrangements for bias transistors are also possible in order to embody the current mirror circuits according to the invention.

The invention claimed is:

1. A traveling wave amplifier comprising:
   (a) a first normally off MOS transistor including a drain terminal, a source terminal and a gate terminal, the drain terminal of the first normally off MOS transistor connected to a drain line and the drain line connected to a first supply voltage potential, the gate terminal of the first normally off MOS transistor connected to a gate line operable to receive an input signal, and the source terminal of the first normally off MOS transistor connected to a second supply voltage potential;
   (b) at least one second normally off MOS transistor including a drain terminal, a source terminal and a gate terminal, the drain terminal of the second normally off MOS transistor connected to the drain line, the gate terminal of the second normally off MOS transistor connected to the gate line, and the source terminal of the second normally off MOS transistor connected to the second supply voltage potential;
   (c) a normally off bias MOS transistor including a drain terminal, a source terminal and a gate terminal, the drain terminal of the normally off bias MOS transistor connected to a reference current source, the gate terminal of the normally off bias MOS transistor connected to the drain terminal of the normally off bias MOS transistor and, the source terminal of the normally off bias MOS transistor connected to the second supply voltage potential via a terminating resistor; wherein the normally off bias MOS transistor forms a current mirror with the second normally off MOS transistor, wherein the drain line is operable to provide an output signal of the traveling wave amplifier.

2. The traveling wave amplifier of claim 1 wherein a buffer capacitor is provided between the gate terminal of the normally off bias MOS transistor and the second supply voltage potential.

3. The traveling wave amplifier of claim 1 wherein the input signal is received onto the gate line via a coupling-in capacitor.

4. The traveling wave amplifier of claim 1 wherein the input signal has a frequency bandwidth of 2 to 11 gigahertz.

5. The traveling wave amplifier of claim 1 wherein inductances are provided between the gates of the MOS transistors and the gate line.

6. The traveling wave amplifier of claim 1 wherein inductances are provided between the drains of the MOS transistors and the drain line.

7. The traveling wave amplifier of claim 1 wherein the drain line is connected to the first supply voltage potential via a connecting resistor.

8. The traveling wave amplifier of claim 1 the source terminal of the second normally off MOS transistor is connected to the second supply voltage potential via a second resistor.

9. A differential traveling wave amplifier comprising:
(a) an input operable to receive a differential input signal, the input connected to a first gate line and a second gate line, wherein a first voltage divider resistor is connected to the first gate line and a second voltage divider resistor is connected to the second gate line, wherein a ground node is positioned between the first voltage divider resistor and the second voltage divider resistor, and wherein a center potential of the input signal is available at the ground node;
(b) an output operable to provide a differential output signal, the output connected to a first drain line and a second drain line, wherein the first drain line and the second drain line are each connected to a first supply voltage potential;
(c) at least one differential amplifier stage including a first MOS amplification transistor, a second MOS amplification transistor, and a MOS current source transistor, wherein a drain terminal of the first MOS amplification transistor is connected to the first drain line, a drain terminal of the second MOS amplification transistor is connected to the second drain line, a gate terminal of the first MOS amplification transistor is connected to the first gate line, a gate terminal of the second MOS amplification transistor is connected to the second gate line, a source terminal of the first MOS amplification transistor is connected to a drain terminal of the MOS current source transistor, a source terminal of the second MOS amplification terminal is also connected to the drain terminal of the MOS current source transistor, and a source terminal of the MOS current source transistor is connected to a second supply voltage potential; and
(d) a cascode arrangement including a first MOS cascode transistor and a second MOS cascode transistor, wherein a drain terminal of the first MOS cascode transistor is connected to a reference current source, the drain terminal and a gate terminal of the first MOS cascode transistor are both connected to the ground node, a source terminal of the first MOS cascode transistor is connected to the gate terminal of the MOS current source transistor, a drain terminal and a gate terminal of the second MOS cascode transistor are both also connected to the gate terminal of the MOS current source transistor, and a source terminal of the second MOS cascode transistor connected to the second supply voltage potential; and wherein the at least one differential amplifier stage and the cascode arrangement form a current mirror.

10. The traveling wave amplifier of claim 9 wherein a buffer capacitor is provided between the gate terminal of the first cascode MOS transistor and the second supply voltage potential.

11. The traveling wave amplifier of claim 9 wherein at least one of the first MOS amplification transistor, the second MOS amplification transistor, the MOS current source transistor, the first MOS cascode transistor or the second MOS cascode transistor is a normally off MOS transistor.

12. The traveling wave amplifier of claim 9 wherein the input signal has a frequency bandwidth of 2 to 11 gigahertz.

13. The traveling wave amplifier of claim 9 wherein inductances are provided on the first drain line and the second.

14. The traveling wave amplifier of claim 9 wherein inductances are provided on the first gate line and the second gate line.

15. The traveling wave amplifier of claim 9 wherein the first drain line and second drain line are connected to the first supply voltage potential via a connecting resistor.

16. A traveling wave amplifier comprising:
(a) a first MOS transistor including a drain terminal, a source terminal and a gate terminal, the drain terminal of the first MOS transistor connected to a drain line and the drain line connected to a first supply voltage potential, the gate terminal of the first MOS transistor connected to a gate line operable to receive an input signal;
(b) at least one second MOS transistor including a drain terminal, a source terminal and a gate terminal, the drain terminal of the second MOS transistor connected to the drain line, the gate terminal of the second MOS transistor connected to the gate line, wherein the source terminal of the first MOS transistor and the source terminal of the second MOS transistor are both connected to the second supply voltage potential; and
(c) a third MOS transistor including a drain terminal, a source terminal and a gate terminal, the drain terminal of the third MOS transistor connected to a reference current source, the gate terminal of the third MOS transistor connected to the drain terminal of the third MOS transistor, and the source terminal of the third MOS transistor connected to a second supply voltage potential;
wherein the drain line is it operable to provide an output signal of the traveling wave amplifier.

17. The traveling wave amplifier of claim 16 wherein a resistor is positioned between the source terminal of the third MOS transistor and the second supply voltage potential.

18. The traveling wave amplifier of claim 16 wherein a fourth MOS transistor is positioned between the source terminal of the third MOS transistor and the second supply voltage potential.

* * * * *